US008533543B2

(12) United States Patent
Barrenscheen et al.

(10) Patent No.: US 8,533,543 B2
(45) Date of Patent: Sep. 10, 2013

(54) SYSTEM FOR TESTING CONNECTIONS BETWEEN CHIPS

(75) Inventors: Jens Barrenscheen, Munich (DE); Harry Siebert, Munich (DE)

(73) Assignee: Infineon Technologies AG, Neubiberg (DE)

( * ) Notice: Subject to any disclaimer, the term of this patent is extended or adjusted under 35 U.S.C. 154(b) by 540 days.

(21) Appl. No.: 12/414,394

(22) Filed: Mar. 30, 2009

(65) Prior Publication Data

US 2010/0244848 A1 Sep. 30, 2010

(51) Int. Cl.
*G01R 31/28* (2006.01)

(52) U.S. Cl.
USPC .............. 714/716; 714/30; 714/724; 324/538

(58) Field of Classification Search
USPC .......................................................... 324/538
See application file for complete search history.

(56) References Cited

U.S. PATENT DOCUMENTS

| | | | | |
|---|---|---|---|---|
| 4,992,973 | A * | 2/1991 | Tamura et al. | 714/30 |
| 6,505,317 | B1 * | 1/2003 | Smith et al. | 714/738 |
| 6,519,688 | B1 * | 2/2003 | Lu et al. | 711/167 |
| 7,324,913 | B2 * | 1/2008 | Clark et al. | 702/122 |
| 7,612,574 | B2 * | 11/2009 | Fujiwara et al. | 324/750.3 |
| 7,650,553 | B2 * | 1/2010 | Komura | 714/733 |
| 2003/0159094 | A1 * | 8/2003 | Smith et al. | 714/715 |
| 2004/0091028 | A1 * | 5/2004 | Aronson et al. | 375/219 |
| 2004/0201382 | A1 * | 10/2004 | Spies et al. | 324/538 |
| 2005/0146829 | A1 * | 7/2005 | Schoenborn | 361/139 |
| 2007/0104111 | A1 * | 5/2007 | Kakizawa | 370/249 |
| 2008/0157782 | A1 * | 7/2008 | Krah | 324/538 |
| 2008/0205170 | A1 * | 8/2008 | Ikeda | 365/193 |
| 2008/0235428 | A1 * | 9/2008 | Yu et al. | 710/309 |
| 2009/0102503 | A1 * | 4/2009 | Saito | 324/765 |

FOREIGN PATENT DOCUMENTS

| | | |
|---|---|---|
| DE | 601 00 754 | 7/2004 |
| WO | WO/0173459 A2 | 10/2001 |

OTHER PUBLICATIONS

DM7407 Hex Buffers with High Voltage Open-Collector Outputs Data Sheet, Fairchild Semiconductor, Mar. 1998, © 1998 Fairchild Semiconductor Corporation DS 006497.*

* cited by examiner

*Primary Examiner* — Melissa Koval
*Assistant Examiner* — Benjamin M Baldridge
(74) *Attorney, Agent, or Firm* — Schiff Hardin LLP

(57) ABSTRACT

In accordance with an aspect of the application, there is provided a system for testing, including a first chip, a second chip, and first and second connections. The first connection is configured to couple a first pin of the first chip to a first pin of the second chip, and to transmit an initial signal from the first chip to the second chip. The second connection is configured to couple a second pin of the first chip to a second pin of the second chip to return the signal as a returned signal to the first chip. The first chip comprises comparison circuitry configured to compare the returned signal with the initial signal.

20 Claims, 13 Drawing Sheets

SYSTEM FOR TESTING CONNECTIONS BETWEEN CHIPS

The application relates to systems for testing a connection between a first and a second chip and/or for testing a plurality of interconnections between a plurality of chips, in particular for use in safety critical applications.

BACKGROUND

For safety critical applications, electronic devices are classified into Safety Integrity Levels (SIL). For this, failure probabilities and behavior of single devices and the entire system are to be determined.

When monitoring a system of several integrated circuits (ICs) or chips on a, e.g., printed circuit board (PCB), one aspect is to check the connections between these ICs.

For production tests, boundary scans are widely used to check all connections of a system to be tested. As this test requires a complete shut down of the system, it is not adequate for tests during operation of the system.

Another approach for checking connections between chips is to let the application software check if proper values are transmitted. This, however, violates the requirement that safety assurance components must be independent, i.e. cannot be taken out of service by a misbehaving application.

Hence, there is a need for a system for testing connections between ICs or chips during operation of the ICs and/or chips to be tested.

BRIEF DESCRIPTION OF THE DRAWINGS

The accompanying drawings are included to provide a further understanding of the present application and are incorporated in and constitute a part of this specification. The drawings illustrate embodiments of the present application and together with the description serve to explain the principles of the application. Other embodiments of the present application and many of the intended advantages of the present application will be readily appreciated as they become better understood by reference to the following detailed description.

DETAILED DESCRIPTION

In the following description, reference is made to the accompanying drawings, which form a part hereof, and in which is shown by way of illustration specific embodiments in which the invention may be practiced. It is to be understood that other embodiments may be utilized and structural or other changes may be made without departing from the scope of the present application. The following detailed description, therefore, is not to be taken in a limiting sense, and the scope of the present application is defined by the appended claims.

Figure 1A:
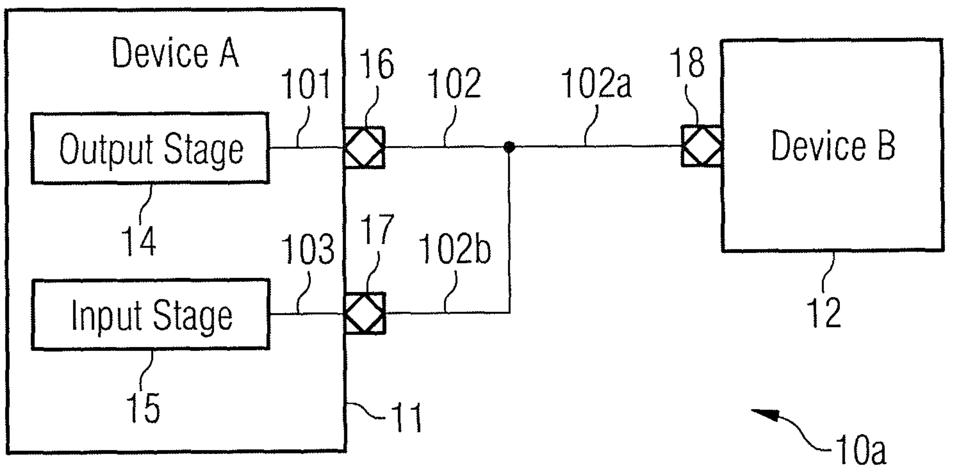
FIG. 1*a* shows a schematic diagram of a system according to an embodiment.

FIG. 1*a* shows a schematic diagram of a system according to an embodiment.

The system 10*a* comprises a first chip or device 11 and a second chip or device 12. The first chip 11 comprises output stage 14, input stage 15, first and second pins 16, 17 and the second chip 12 comprises third pin 18.

The output stage 14 is connected to the first pin 16 via connection 101 and the first pin 16 of the first chip 11 is further connected to the third pin 18 of the second chip 12 via connections 102, 102*a* and to the second pin 17 of the first chip 11 via connections 102, 102*b*. The second pin 17 of the first chip 11 is further connected to the input stage 15 via connection 103.

In the embodiment shown in FIG. 1*a*, the signal which is sent from the first chip 11 to the second chip 12 is also returned directly to the first chip, or rather to the second pin 17 of the first chip 11. Thus, the signal output via the first pin 16 is directly returned to the second pin 17 from outside the first chip 11 which allows to check possibly defective bondings and soldering joints of the first chip 11, but not the quality of the signal arriving at the second chip 12.

Figure 1B:
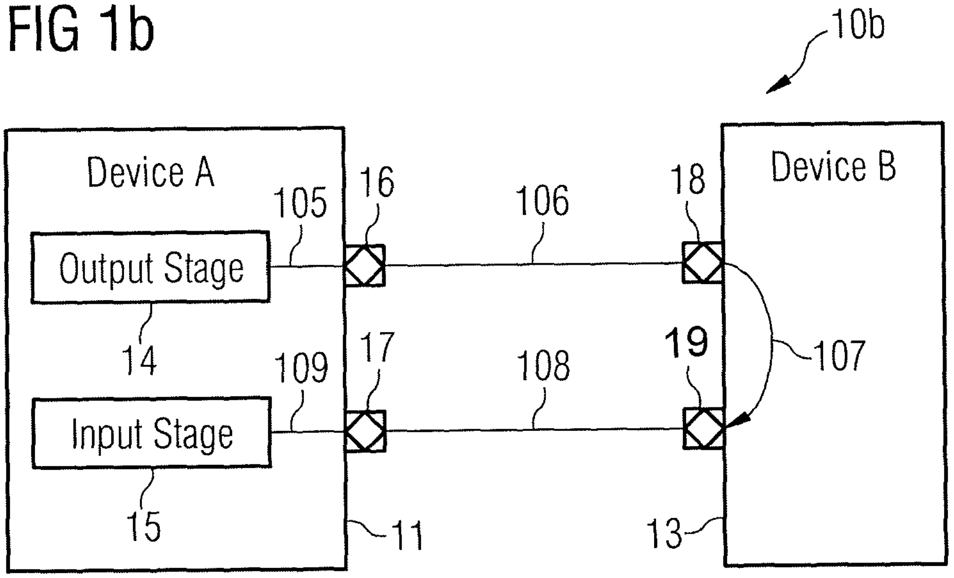
FIG. 1*b* shows a schematic diagram of a system according to a further embodiment.

The embodiment of FIG. 1*b* remedies this shortcoming, however, at the cost of an additional pin for the second chip 12.

The system 10*b* comprises a first chip or device 11 which corresponds to the first chip 11 of the system 10*a* shown in FIG. 1*a* and a second chip or device 13. The first chip 11 comprises output stage 14, input stage 15, and first and second pins 16, 17. The second chip 13 essentially corresponds to the second chip 12 of system 10*a*, but comprises two pins, third pin 18 and fourth pin 19.

The output stage 14 is connected to the first pin 16 via connection 105 and the first pin 16 of the first chip 11 is further connected to the third pin 18 of the second chip 12 via connection 106. The third pin 18 is connected to the fourth pin 19 within the second chip 13 via connection 107, wherein the fourth pin 19 is further connected to the second pin 17 of the first chip 11 via connection 108. The second pin 17 is further connected to the input stage 15.

The embodiment shown in FIG. 1*b*, the system 10*b*, enables monitoring of the entire transmission path and the pad structure of the second chip 13 as the respective signal is returned within the second chip 13, via the additional fourth pin 19 of the second chip. This embodiment involves higher production costs for the second chip, however.

Advantageously, the signal may be returned from the second chip 13 to the first chip 11 in a modified form. Accordingly, the signal may be inverted within the second chip 13 before returning the—now inverted—signal to the first chip 11. Thereby, a kind of "sign of life" may be obtained from the second chip 13 which enables detection of possible shortcuts in the transmission path between transmitting and returning the signal. Further, a missing or failing power supply is also detected by actively inverting the returned signal. A failing clock could also be detected if the inversion is done by a flip-flop. This, however, causes latency as the returned signal can not be checked earlier than after one clock period.

For checking the signals, i.e. comparing the (original) signal with the returned signal, an additional generic logic may advantageously be provided. This is a more efficient way to carry out the signal comparison than to let the respective functional modules check the signals themselves.

Modern devices, e.g. microcontrollers, often provide more logic functions than port pins. Accordingly, a port pin may have to drive and receive different signals from several modules. A user of these devices may specify which signal is available at which pin. For these devices, it is particularly advantageous to provide means for monitoring signals independent from the function of the signals.

Figure 2:
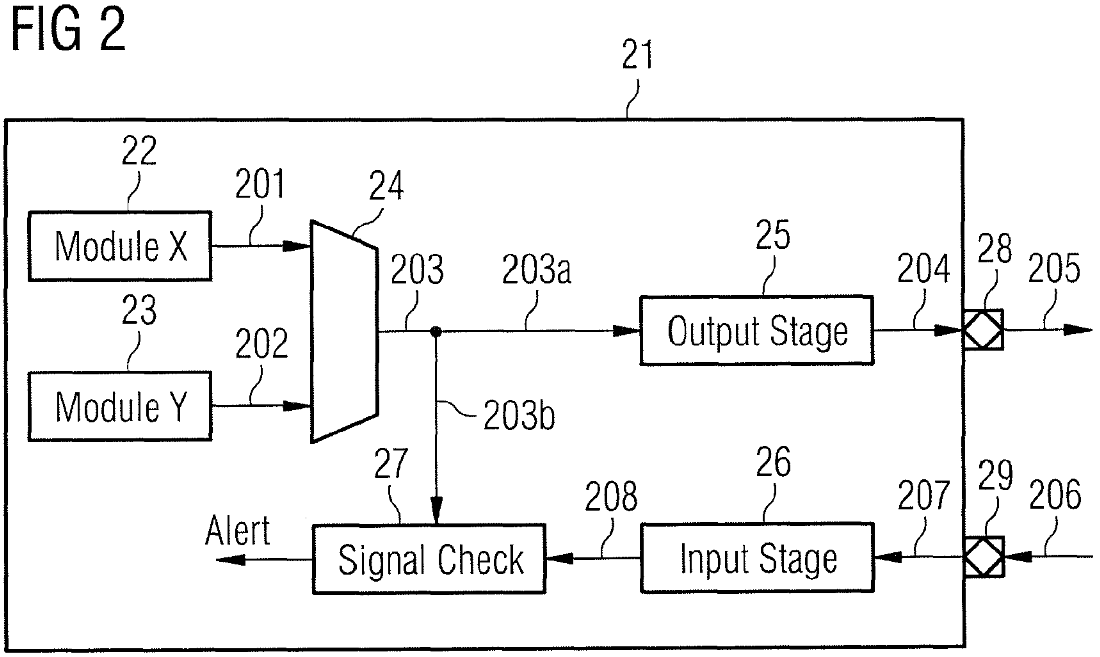
FIG. 2 shows a schematic diagram of a section of a chip according to a further embodiment.

FIG. 2 shows a chip according to an embodiment which may be implemented in the systems 10*a* and 10*b* of FIGS. 1*a* and 1*b*, respectively.

The chip 21, for example a microcontroller, comprises a first module 22, a second module 23, a multiplexer 24, an output stage 25, an input stage 26, a signal check block 27, a first pin 28, and a second pin 29.

The first module 22 and the second module 23 are connected to the multiplexer 24 via connections 201 and 202, respectively. The multiplexer 24 is further connected to the output stage 25 via connections 203, 203*a* and to the signal check block 27 via connections 203, 203*b*. The output stage 25 is further connected to the first pin 28 via connection 204. The second pin is connected, via connection 207, to the input stage 26 which is also connected to the signal check block 27 via connection 208. The signal check block 27 is connected to the multiplexer 24 and the input stage 26.

The chip 21 of FIG. 2 enables the user to select the functional signal to be driven to the first pin 28, i.e. in this case, to choose from which module, the first module 22 or the second module 23, a functional signal is driven to the first pin 28. The functional signal from the selected module may then be returned, for example, according to one of the embodiments described above with reference to FIGS. 1*a* and 1*b*, or other means for returning the signal.

The returned signal is received at the second pin 29 and forwarded via the input stage 26 to the signal check block 27. The signal check block 27 receives both the selected functional signal and the returned signal at its inputs and checks the signals.

A simple test may be to provide the selected functional signal and the returned signal with edge detection capability. A state machine may monitor the order of edges (e.g. rising edge of the functional signal—rising edge of the returned signal—falling edge of the functional signal—falling edge of the returned signal—etc.). In case a different edge occurs than the expected one, an alarm signal may be enabled to indicate an error. Depending on the application, the alarm signal may cause an interrupt, a trap, or even a reset.

A possible inversion of the returned signal may be compensated by an additional inversion of the returned signal within the input stage 26 so that the signal check block 27 is not affected by an inversion of the signal in the target device.

The signal check block 27 is advantageously implemented in the vicinity of the port pins as this location reduces line length within the chip. However, it is, of course, not mandatory to locate the signal check block 27 near the port pins.

The described architecture of chip 21 provides a quasi all-purpose signal monitoring means which is not limited to a particular kind of functional signal, but may be employed for monitoring signals of any kind of functional modules. Thus, different complexities of signal monitoring are easy to implement within a device or chip as only the amount of signal check blocks has to be adjusted.

Furthermore, the implementation of the signal check block 27 as a simple and inexpensive state machine in a chip leaves the option open to utilize the additional (and expensive) pin for another functionality (not as input for returned signals).

Further, as the signal test capability is implemented within a chip, but outside the respective functional modules, the functional modules do not become even more complex and, therefore, do not require additional chip area for implementing the test capability within the respective functional module.

Advantageously, the signal check logic of signal check block 27 may be extended in that the signal characteristics are monitored time dependently. For example, it may be useful to determine that two edges of the functional signal do not follow in a too close succession. In this way, an additional monitoring information may be obtained, in particular, if the signal check block 27 is provided with a clock independent from the system clock of the microprocessor. Additionally, the time between an edge of the functional signal and the corresponding edge of the returned signal may provide information about the nature of the error occurring in the system such as changes in the impedance of connections caused by cold soldering joints, arising hairline cracks or corrosion.

Figure 3:
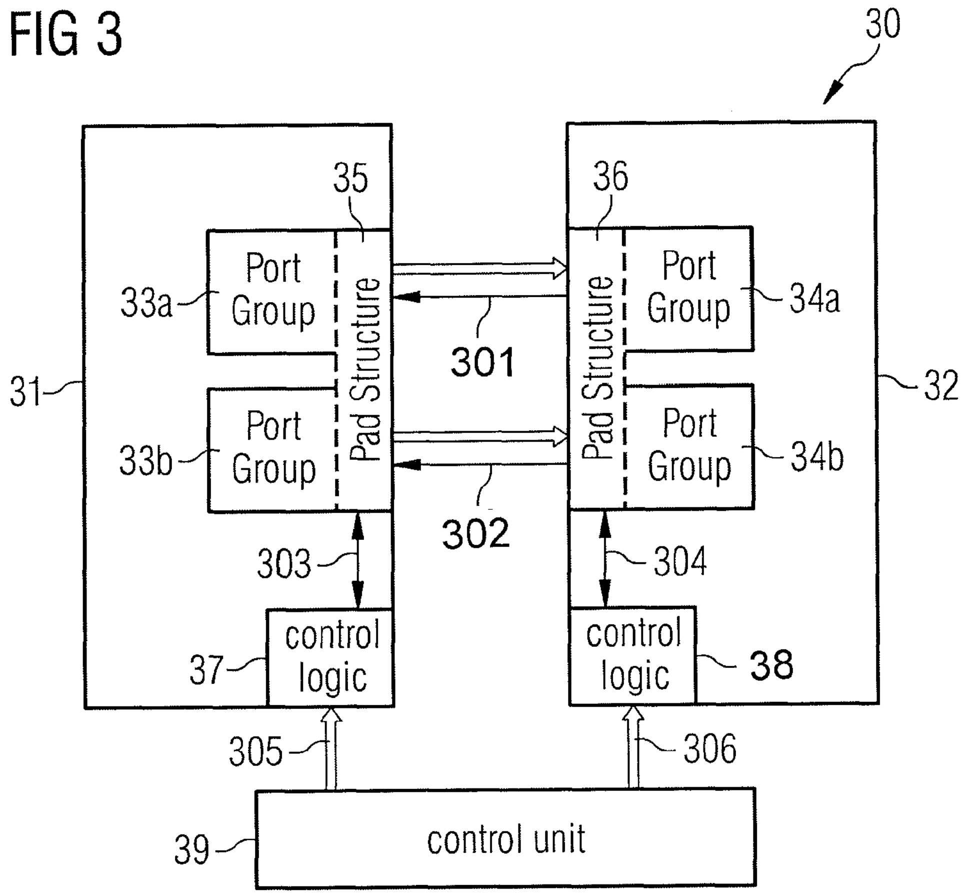
FIG. 3 shows a schematic diagram of a section of a system according to a further embodiment.

FIG. 3 shows a schematic diagram of a section of a system according to a further embodiment.

The system 30 comprises a first chip 31, a second chip 32, and a control unit 39 connected to the first and second chips via connections 305 and 306, respectively. However, it is to be noted that the control unit 39 may also be part of the first chip 31 or the second chip 32, though depicted as a separate chip in FIG. 3.

The first chip 31 comprises a first port group 33*a*, a second port group 33*b*, a first pad structure 35, and a first control logic 37 which is connected to the first pad structure 35 via connection 303 and to the control unit via connection 305.

The second chip 32 comprises a third port group 34*a*, a fourth port group 34*b*, a second pad structure 36, and a second control logic 38 which is connected to the second pad structure via connection 304 to the control unit 39 via connection 306.

The embodiment shown in FIG. 3 utilizes connections and pins which are already existent in the system 30 as return path for signals to be tested, i.e. no additional pins are required for the test. For testing purposes, relevant connections are considered as distinct sets of point-to-point wires between devices independent of their application content, wherein all connections between two devices are bundled and processed together. A central control unit controls the pad structures by means of control logic circuitries added to the devices whose connections are to be tested. For this reason, the pad structures of common chips are slightly modified, i.e. circuitry is added to receive control signals from the respective control logic on the same chip. By controlling the modified pad structures from outside, i.e. from the central control unit, it is possible to select direction of data flow (in and out) and transported value (1 or 0) independent of the device application. The modified pad structures are also configured to check the returned signal and to transmit the result, hereinafter called "check signal", to the respective control logic.

The input/output pins (IO pins) of a device may be split into groups according to their connectivity, wherein all signals grouped in one device are connected to the same counterpart device and signals grouped in the one device are also grouped in the counterpart device. There may be several groups of signals in one device, but each signal belongs to one group only. Data flow direction is not relevant for the grouping and signals deemed not critical, i.e. signals which have not to be tested, may be disregarded in the test.

Figure 4:
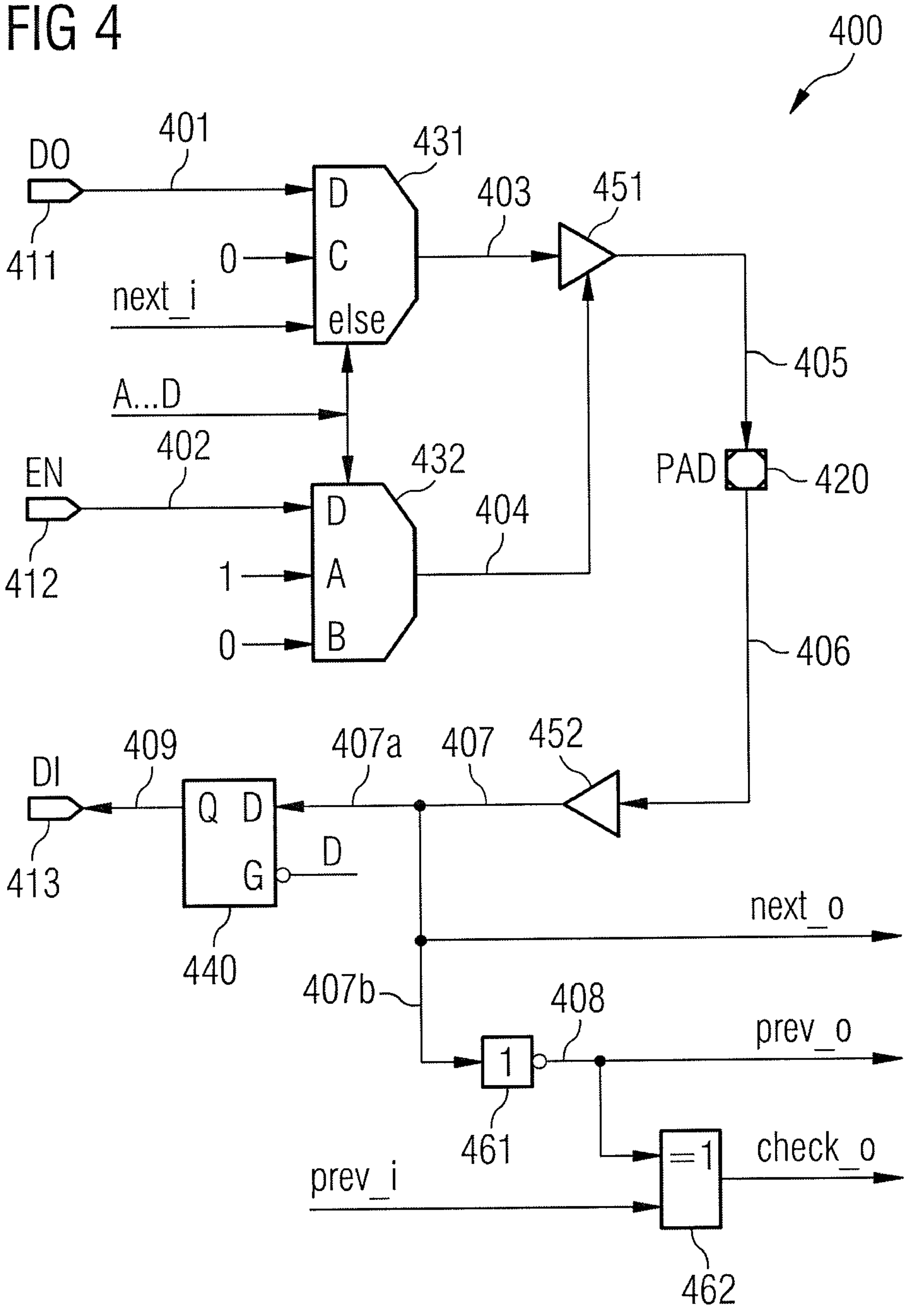
FIG. 4 shows an embodiment of a pad structure.

In FIG. 4, an embodiment of a pad structure is shown. However, it is to be noted that the embodiment shown in FIG. 4 represents only a possible design for a pad structure which could be implemented in a system. Of course, any other suitable designs for pad structures may also be implemented.

The pad structure 400 of FIG. 4 comprises a first input 411 and a second input 412, output 413, a first multiplexer 431, a second multiplexer 432, input driver 452, pad 420, output driver 451, latch 440, NOT gate 461, and XOR gate 462.

The first input 411 is connected to a first input of the first multiplexer 431 via connection 401. The second input 412 is connected to a second input of the first multiplexer 431 via connection 402. A first input of output driver 451 is connected with an output of the first multiplexer 431 via connection 403 and a second input of the output driver 451 is connected with an output of the second multiplexer via connection 404. An output of the output driver 451 is connected with the pad 420 via connection 405, wherein the pad 420 is further connected with an input of the input driver 452 via connection 406. An output of the input driver 452 is connected to an input of the latch 440 via connections 407 and 407*a* and to an input of the NOT gate 461 via connections 407 and 407*b*. An output of the NOT gate 461 is connected with an input of the XOR gate via connection 408 and an output of the latch 440 is connected with the output 413 via connection 409.

The pad structure is controlled by control signals, e.g. "A", "B", "C", "D", received at the multiplexers 431, 432 and the latch 440 from an associated control logic: First, the control signals identify which input of the multiplexers 431, 432 are forwarded to the output driver 451: Only, if a certain control signal is asserted, e.g. "D", signals received at the inputs 411, 412 are forwarded to the output driver 451. Otherwise, i.e. for example, one or more of the control signals "A", "B" or "C" are asserted, signals required for testing (as will be described in further detail below) may be forwarded or no signal may be forwarded at all. Second, the control signals establish the operation mode of the latch 440: The latch is transparent while a certain control signal is asserted, e.g. "D", but keeps its previous value as soon and as long as the certain signal, e.g. "D", is de-asserted.

For the exemplary set of control signals "A", "B", "C", and "D", the following modes of operation may be established:

D: "normal function", the device operates according to its intended use;

C+A: actively drive "0" to the pad and forward it to the "upper" neighbor (next_o);

C+B: compare complement of input value sent by "lower" neighbor (prev_i);

A: drive value received (and inverted) from "upper" neighbor (next_i);

B: forward complement of received value to "lower" neighbor (prev_o).

Each of the plurality of pad structure blocks of a pad structure of a respective chip is bi-directionally connected to its two neighbors in its signal group. These connections form a ring (or, strictly speaking, two rings:

next_o=>prev_i and prev_o=>next_i) as the last pad structure block is connected to the first pad structure block. Further, each pad structure block generates an output or check signal (check_o) and forwards it to the control logic.

By proper control of the pad structures, two neighbored connection wires can now be tested in a loop fashion as shown in table 1:

TABLE 1

Elementary check loop

| First chip | | | Wire | Second chip | | |
|---|---|---|---|---|---|---|
| Index | Mode | Functionality | Wire | Functionality | Mode | index |
| i + 1 | C + A | Send "0";<br>Compare (not "0") to "1" | →"0"→ | Receive "0"<br>Pass down not "0" (via prev_o) | B | i + 1 |
| i | C + B | Receive "1"<br>Pass up 1 (via next_o)<br>Compare (not"1") to "0" | ←"1"← | Return "1" | A | i |
| i − 1 | C + A | Send "0";<br>Compare (not "0") to "1" | →"0"→ | Receive "0"<br>Pass down not "0" (via prev_o) | B | i − 1 |

Data flow direction on the wire can be reversed by the controller by giving mode "C" to the second chip (swap table left to right), while the value transmitted is controlled by the A/B assignment (replace "A" with "B" and vice versa in the table). Note that each pad value is always checked for both polarities in parallel.

To illustrate operation of the abovementioned test method, several steps of the test will be described with reference to FIGS. 5*a*-5*g* wherein a system of two chips each having four pins is used as an example. The two chips are connected such that each pin of the first chip is connected with a respective pin of the second chip. However, it is to be noted that the embodiment shown in FIGS. 5*a*-5*g* and described in the following is only used as an example on the basis of which aspects of the invention are illustrated. The invention may be implemented in a system comprising any number of chips, wherein the chips may comprise any number of pins.

In each of the FIGS. 5*a*-5*g*, there are shown four pad structure blocks 51*a*-51*d* being part of a first chip and four further pad structure blocks 52*a*-52*d* being part of a second chip.

The pad structure blocks 51*a*-51*d* are bi-directionally connected to their two respective neighbors among each other, wherein the blocks 51*d* and 51*a* are considered neighbors of each other. Accordingly, block 51*a* is connected to block 51*b* and block 51*d*, block 51*b* is connected to block 51*c* and block 51*a*, etc.

The pad structure blocks 52*a*-52*d* are also bi-directionally connected to their two respective neighbors among each other, wherein the blocks 52*d* and 52*a* are considered neighbors of each other. Accordingly, block 52*a* is connected to block 52*b* and block 52*d*, block 52*b* is connected to block 52*c* and block 52*a*, etc.

Figure 5A:
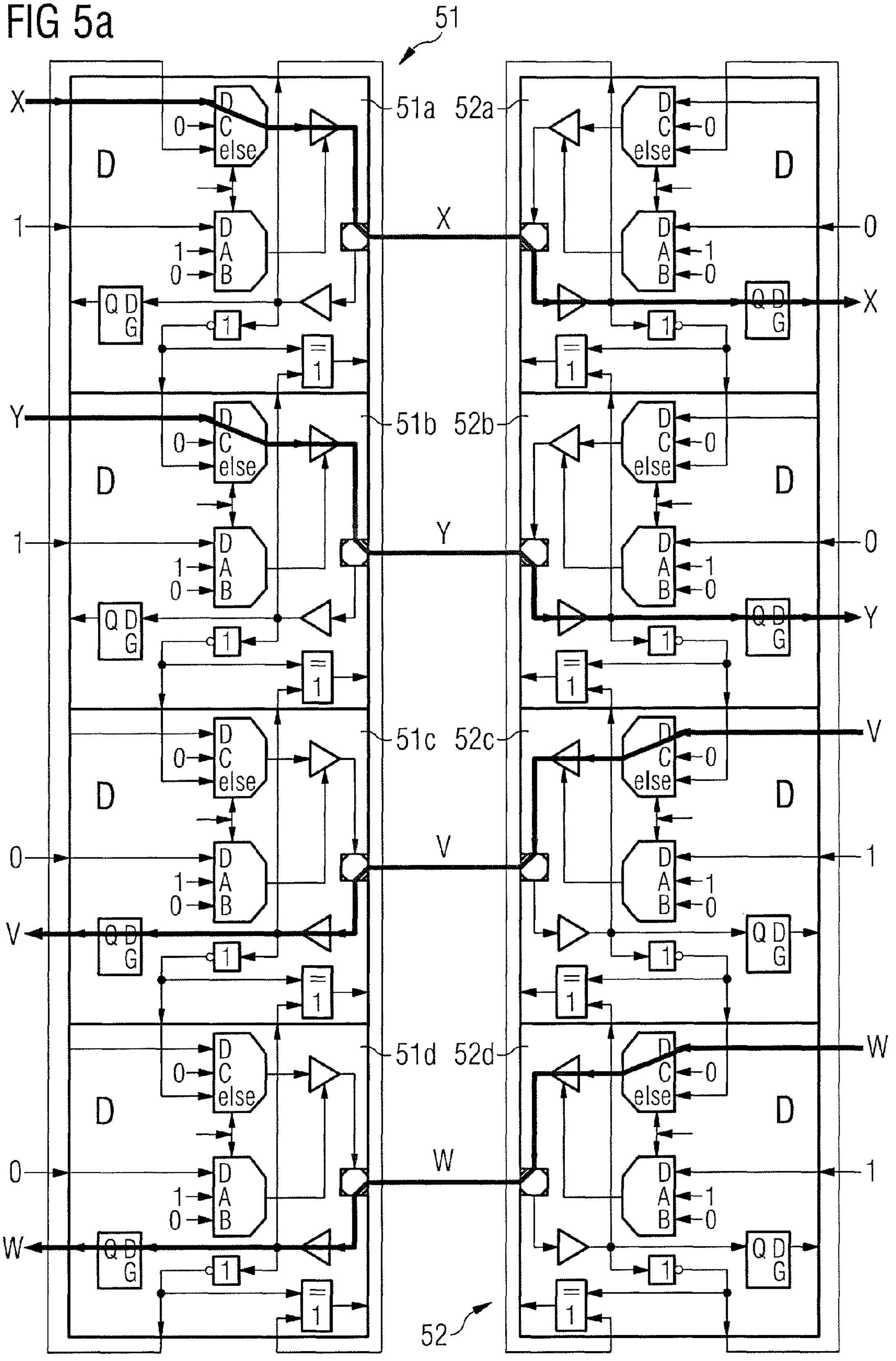
FIGS. 5*a*-5*g* illustrate operation of a section of a system according to a further embodiment wherein 7 different states of the section of the system are depicted.

In FIG. 5*a*, the control signal "D" is asserted for each pad structure causing the chips/devices to operate according to their intended use. In this mode of operation, the functional signals "X" and "Y" are forwarded from pad structure blocks 51*a*, 51*b* to pad structure block 52*a*, 52*b*, respectively, and the functional signals "V", "W" are forwarded from pad structure blocks 52*c*, 52*d* to pad structure blocks 51*c*, 51*d*, respectively.

In the following steps, which are depicted in FIGS. 5*b*-5*g* the actual test is carried out, wherein after six steps (FIGS. 5*b*-5*g*) one loop of the test is completed. Throughout these steps (FIGS. 5*b*-5*g*), the control signal "D" is de-asserted. Thus, the latches comprised in the pad structure blocks 51*c*, 51*d*, 52*a*, and 52*b* keep their previous values and forward the functional signals "V", "W", "X", and "Y", respectively (as long as the control signal "D" is de-asserted).

Figure 5B:
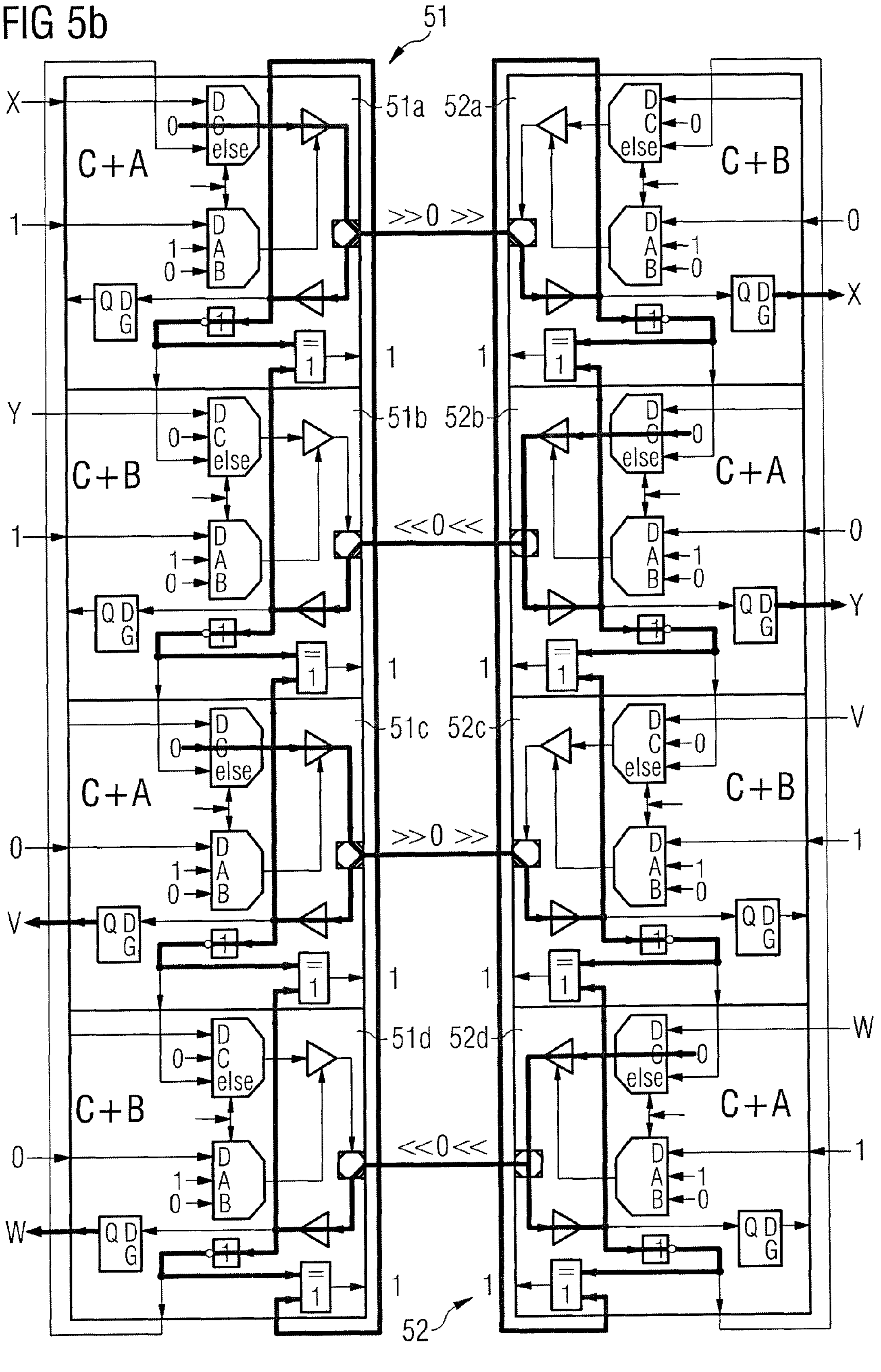

In the next step, now referring to FIG. 5*b*, the control signal "C+A" is asserted in pad structure blocks 51*a* and 51*c* causing them to drive a "0" to their pads and forward the "0" to pad structure blocks 52*a* and 52*c*, respectively, and also to their "upper" neighbors, the blocks 51*d* and 51*b*, respectively. Additionally, the value "0" is inverted ("not 0") and compared with a value received from their "lower" neighbors, the blocks 51*b* and 51*d*, respectively. Further, pad structure blocks 52*a* and 52*c* receive the control signal "C+B" which causes the blocks 52*a* and 52*c* to receive and forward the "0" to their "upper" neighbors, the blocks 52*d* and 52*b*, respectively, and to compare the complement of the received value ("not 0") with a value received from their "lower" neighbors, pad structure blocks 52*b* and 52*d*, respectively.

In the same step, pad structure blocks 52*b* and 52*d* receive the control signal "C+A" which causes the pad structure blocks 52*b* and 52*d* to drive a "0" to their pads and forward the "0" to pad structure blocks 51*b* and 51*d*, respectively, and also to their "upper" neighbors, the blocks 52*a* and 52*c*, respectively. Additionally, the value "0" is inverted ("not 0") and compared with a value received from their "lower" neighbors, the blocks 52*a* and 52*c*, respectively. In pad structure blocks 51*b* and 51*d*, the control signal "C+B" is asserted which causes the blocks 51*b* and 51*d* to receive and forward the "0" to their "upper" neighbors, the blocks 51*a* and 51*c*, respectively, and to compare the complement of the received value ("not 0") with a value received from their "lower" neighbors, blocks 51*c* and 51*a*, respectively.

Figure 5C:
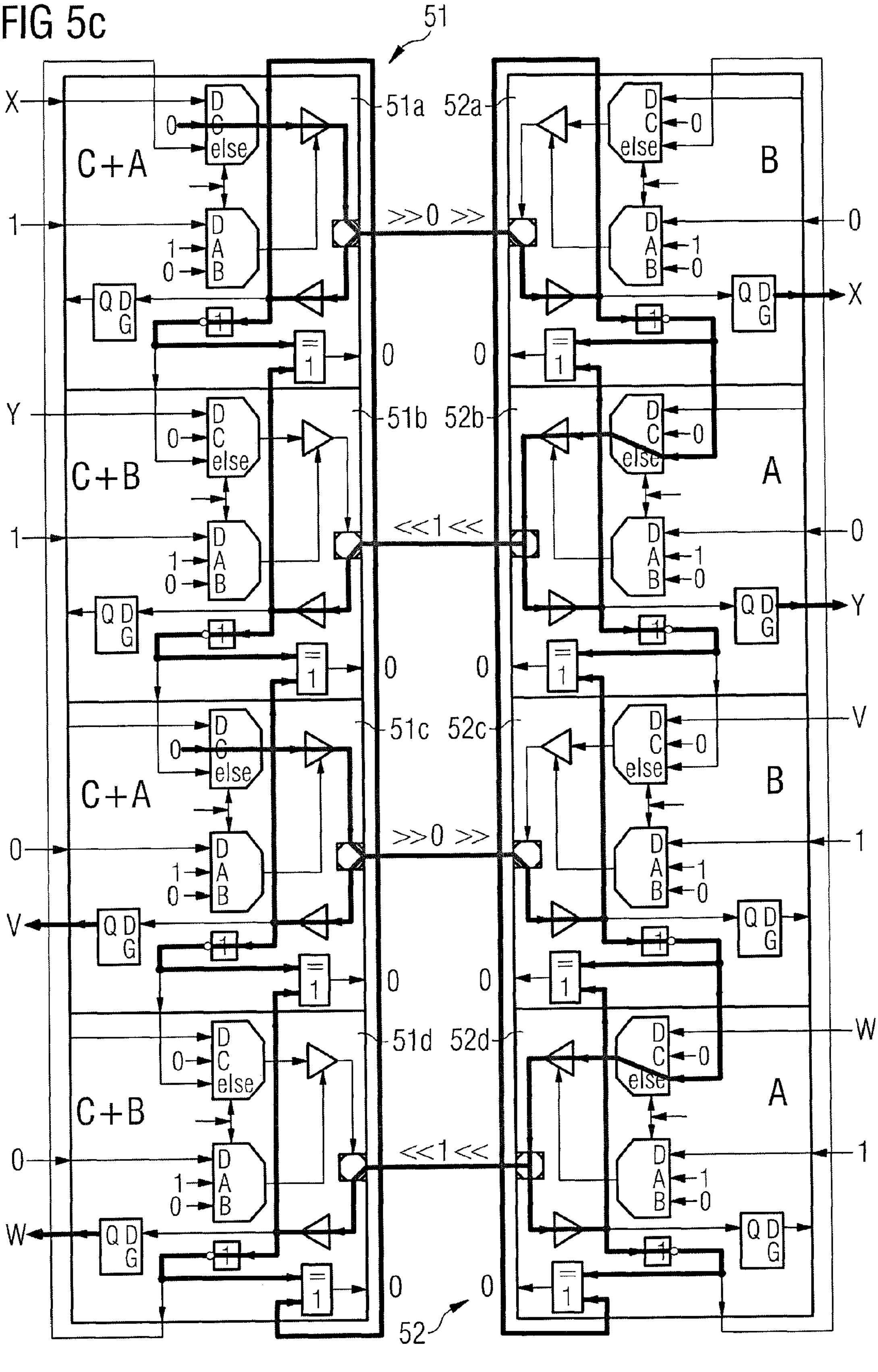

In the next step, referring now to FIG. 5*c*, the control signal "C+A" is further asserted in pad structure blocks 51*a* and 51*c* causing them to drive a "0" to their pads and forward the "0" to pad structure blocks 52*a* and 52*c*, respectively, and also to their "upper" neighbors, 51*d* and 51*b*, respectively. Additionally, the value "0" is inverted ("not 0") and compared with a value received from their "lower" neighbors, the blocks 51*b* and 51*d*, respectively. Further, pad structure blocks 52*a* and 52*c* receive the control signal "B" which causes the blocks 52*a* and 52*c* to receive and forward the "0" to their "upper" neighbors, the blocks 52*d* and 52*b*, respectively, to invert the received value and to forward the inverted value ("not 0") to their "lower" neighbors, the blocks 52*b* and 52*d*, respectively, and to compare the inverted value ("not 0") with a value received from their "lower" neighbors, pad structure blocks 52*b* and 52*d*, respectively.

In the same step, pad structure blocks 52*b* and 52*d* receive the control signal "A" which causes the blocks 52*b* and 52*d* to receive a value ("1") from their "upper" neighbors, the blocks 52*a* and 52*c*, respectively, drive and forward this value ("1") to pad structure blocks 51*b* and 51*d*, respectively, and invert this value ("not 1") and compare it with a value received from their "lower" neighbors, the blocks 52*c* and 52*a*, respectively. In pad structure blocks 51*b* and 51*d*, the control signal "C+B" is asserted which causes the blocks 51*b* and 51*d* to receive and forward the "1" to their "upper" neighbors, the blocks 51*a* and 51*c*, respectively, and to compare the complement of the received value ("not 1") with a value received from their "lower" neighbors, blocks 51*c* and 51*a*, respectively.

Figure 5D:
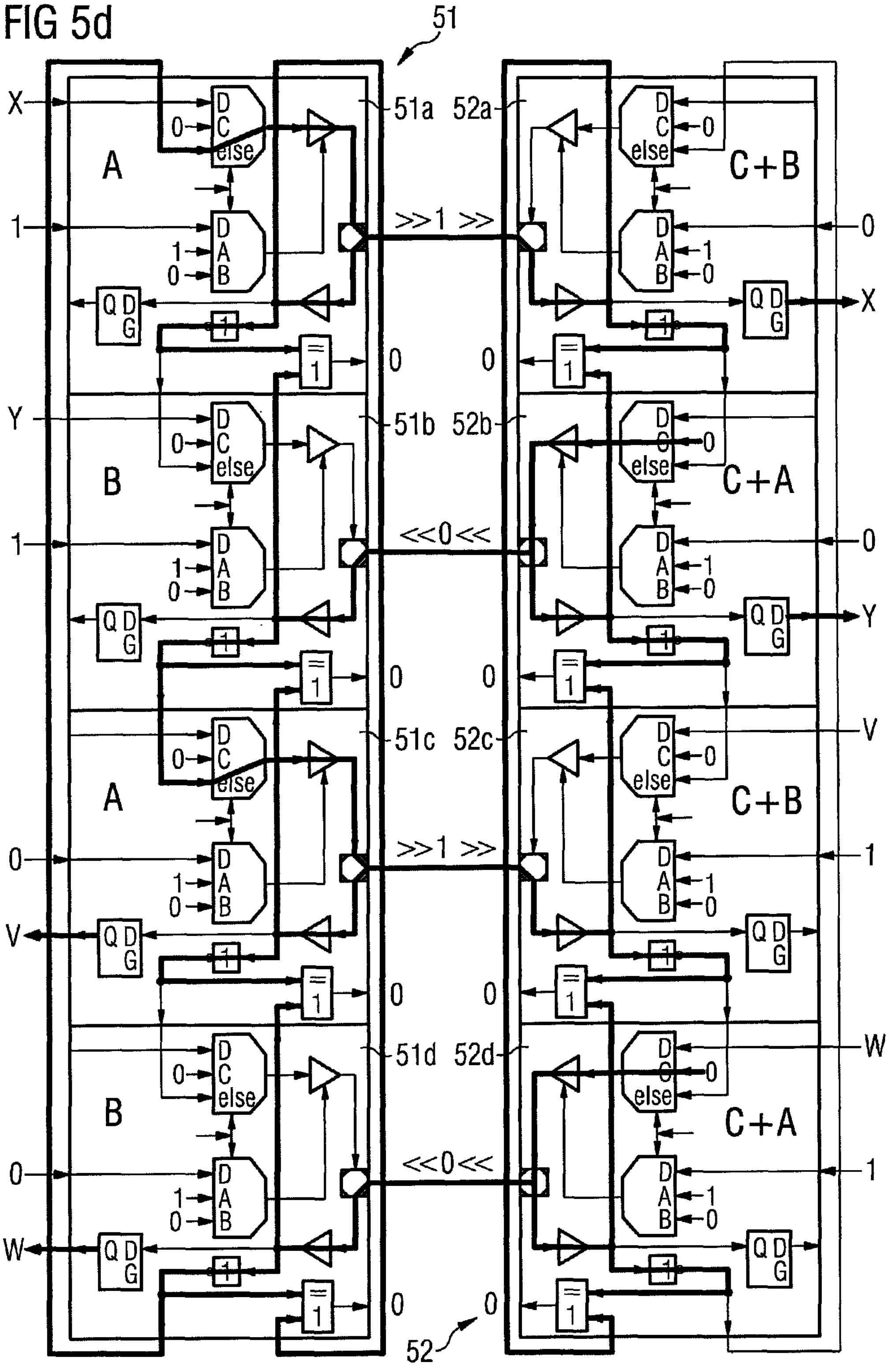

In the, in turn, next step, referring now to FIG. 5*d*, the control signal "A" is asserted in the pad structure blocks 51*a* and 51*c* causing the blocks 51*a* and 51*c* to receive a value ("1") from their "upper" neighbors, the blocks 51*d* and 51*b*, respectively, drive and forward this value ("1") to pad structure blocks 52*a* and 52*c*, respectively, and invert this value ("not 1") and compare it with a value received from their "lower" neighbors, the blocks 51*b* and 51*d*, respectively. In pad structure blocks 52*a* and 52*c*, the control signal "C+B" is asserted which causes the blocks 52*a* and 52*c* to receive and forward the "1" to their "upper" neighbors, the blocks 52*d* and 52*b*, respectively, and to compare the complement of the received value ("not 1") with a value received from their "lower" neighbors, blocks 52*b* and 52*d*, respectively.

In the same step, pad structure blocks 52*b* and 52*d* receive the control signal "C+A" which causes the pad structure blocks 52*b* and 52*d* to drive a "0" to their pads and forward the "0" to pad structure blocks 51*b* and 51*d*, respectively, and forward the "0" also to their "upper" neighbors, the blocks 52*a* and 52*c*, respectively. Additionally, the value "0" is inverted ("not 0") and compared with a value received from their "lower" neighbors, the blocks 52*c* and 52*a*, respectively. In pad structure blocks 51*b* and 51*d*, the control signal "B" is asserted which causes the blocks 51*b* and 51*d* to receive and forward the "0" to their "upper" neighbors, the blocks 51*a* and 51*c*, respectively, and to invert the received value and to forward the inverted value ("not 0") to their "lower" neighbors, the blocks 51*c* and 51*a*, respectively, and to compare the inverted value ("not 0") with a value received from their "lower" neighbors, blocks 51*c* and 51*a*, respectively.

Figure 5E:
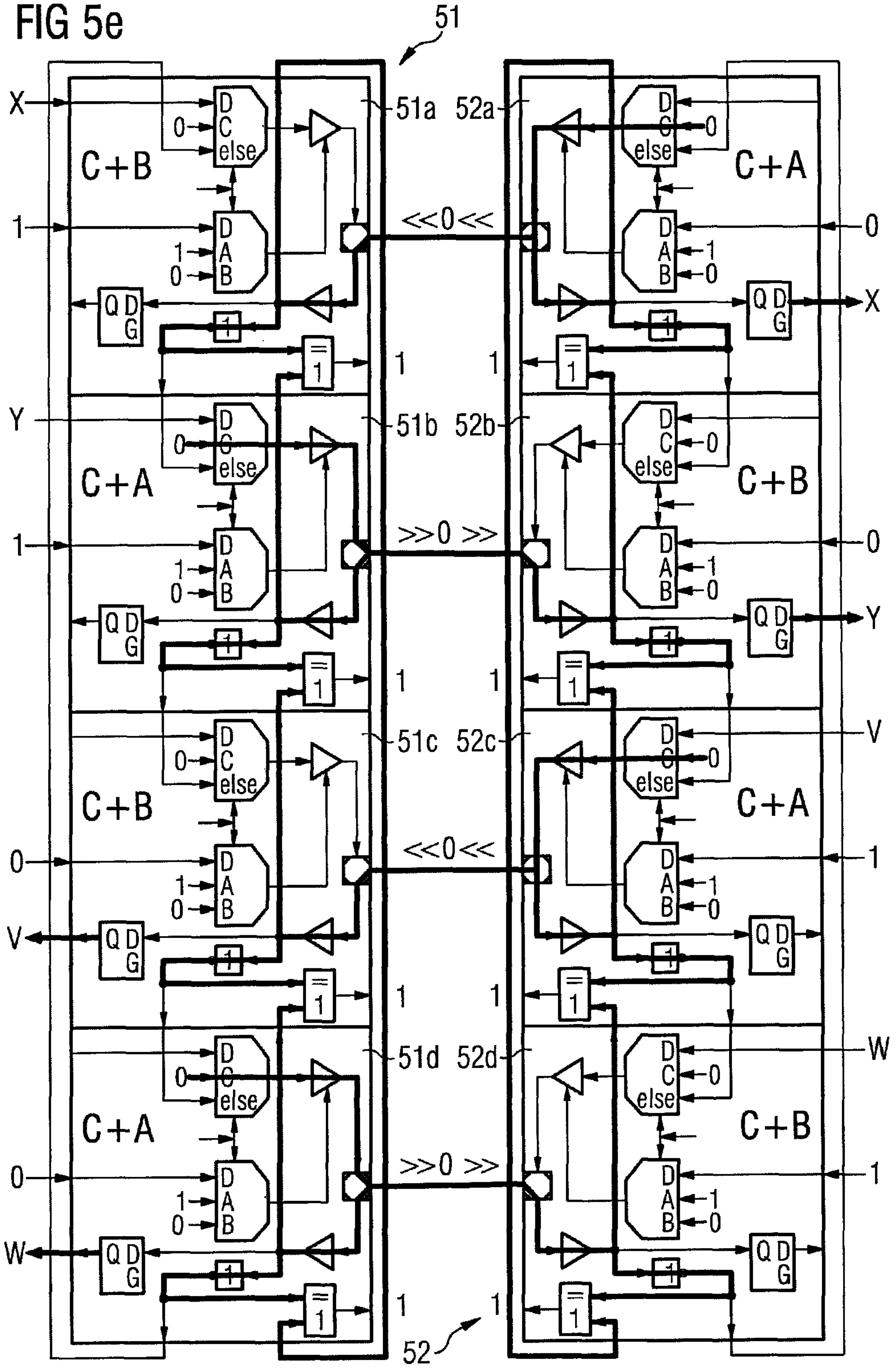

In the, in turn, next step, referring now to FIG. 5*e*, the control signal "C+A" is asserted in pad structure blocks 52*a* and 52*c* causing them to drive a "0" to their pads and forward the "0" to pad structure blocks 51*a* and 51*c*, respectively, and also to their "upper" neighbors, 52*d* and 52*b*, respectively. Additionally, the value "0" is inverted ("not 0") and compared with a value received from their "lower" neighbors, the blocks 52*b* and 52*d*, respectively. Further, pad structure blocks 51*a* and 51*c* receive the control signal "C+B" which causes the blocks 51*a* and 51*c* to receive and forward the "0" to their "upper" neighbors, the blocks 51*d* and 51*b*, respectively, and to compare the complement of the received value ("not 0") with a value received from their "lower" neighbors, pad structure blocks 51*b* and 51*d*, respectively.

In the same step, pad structure blocks 51*b* and 51*d* receive the control signal "C+A" which causes the pad structure blocks 51*b* and 51*d* to drive a "0" to their pads and forward the "0" to pad structure blocks 52*b* and 52*d*, respectively, and, also to their "upper" neighbors, 51*a* and 51*c*, respectively. Additionally, the value "0" is inverted ("not 0") and compared with a value received from their "lower" neighbors, the blocks 51*c* and 51*a*, respectively. In blocks 52*b* and 52*d*, the control signal "C+B" is asserted which causes the blocks 52*b* and 52*d* to receive, forward the "0" to their "upper" neighbors, the blocks 52*a* and 52*c*, respectively, and to compare the complement of the received value ("not 0") with a value received from their "lower" neighbors, blocks 52*c* and 52*a*, respectively.

Figure 5F:
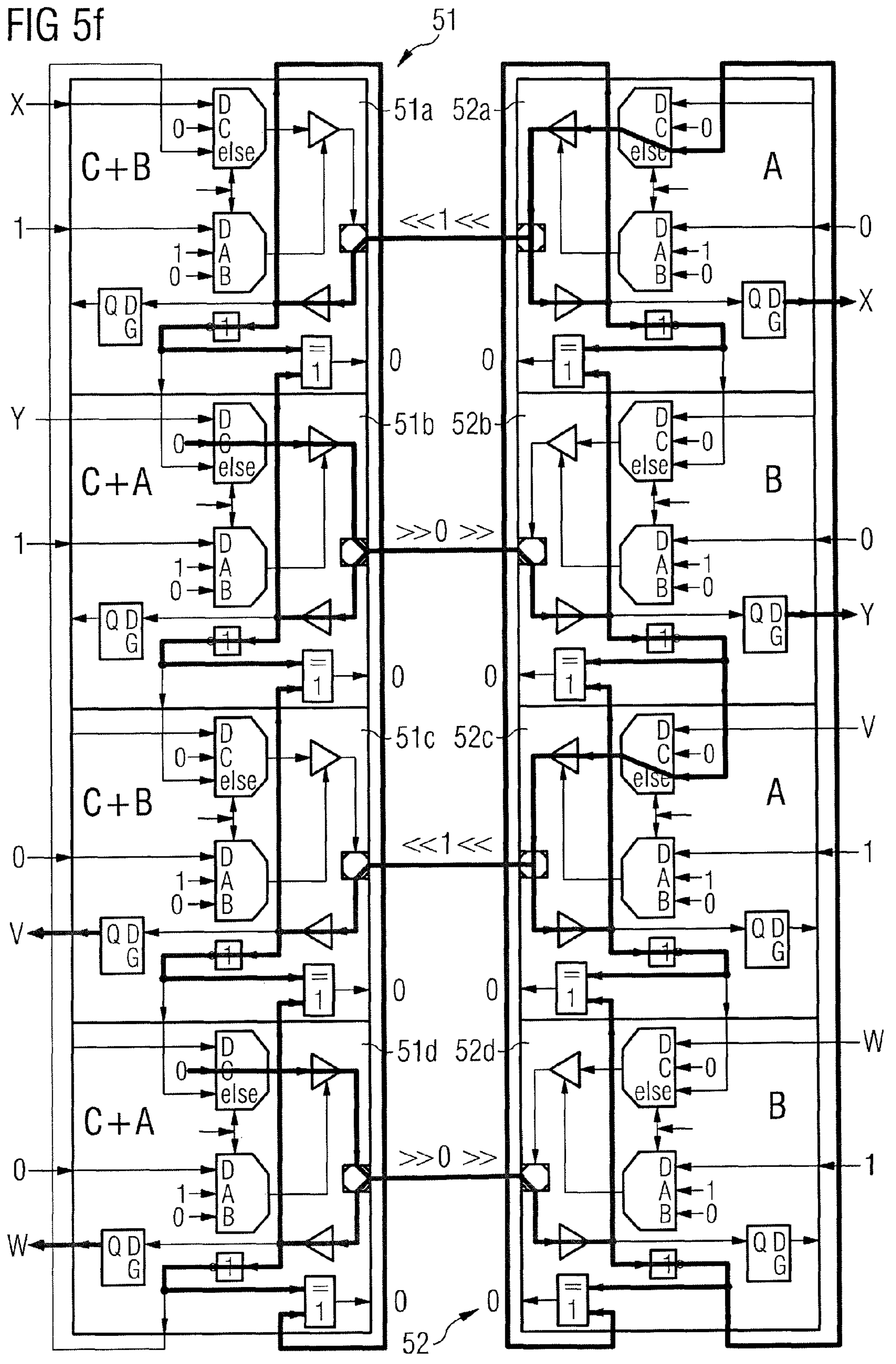

In the, in turn, next step, referring now to FIG. 5*f*, pad structure blocks 52*a* and 52*c* receive the control signal "A" which causes the blocks 52*a* and 52*c* to receive a value ("1") from their "upper" neighbors, the blocks 52*d* and 52*b*, respectively, drive and forward this value ("1") to pad structure blocks 51*a* and 51*c*, respectively, and invert this value ("not 1") and compare it with a value received from their "lower" neighbors, the blocks 52*b* and 52*d*, respectively. In pad structure blocks 51*a* and 51*c*, the control signal "C+B" is asserted which causes the blocks 51*a* and 51*c* to receive and forward the "1" to their "upper" neighbors, the blocks 51*d* and 51*b*, respectively, and to compare the complement of the received value ("not 1") with a value received from their "lower" neighbors, blocks 51*b* and 51*d*, respectively.

In the same step, the control signal "C+A" is asserted in pad structure blocks 51*b* and 51*d* causing them to drive a "0" to their pads and forward the "0" to pad structure blocks 52*b* and 52*d*, respectively, and also to their "upper" neighbors, 51*a* and 51*c*, respectively. Additionally, the value "0" is inverted ("not 0") and compared with a value received from their "lower" neighbors, the blocks 51*c* and 51*a*, respectively. Further, pad structure blocks 52*b* and 52*d* receive the control signal "B" which causes the blocks 52*b* and 52*d* to receive and forward the "0" to their "upper" neighbors, the blocks 52*a* and 52*c*, respectively, to invert the received value and to forward the inverted value ("not 0") to their "lower" neighbors, the blocks 52*c* and 52*a*, respectively, and to compare the inverted value ("not 0") with a value received from their "lower" neighbors, pad structure blocks 52*c* and 52*a*, respectively.

Figure 5G:
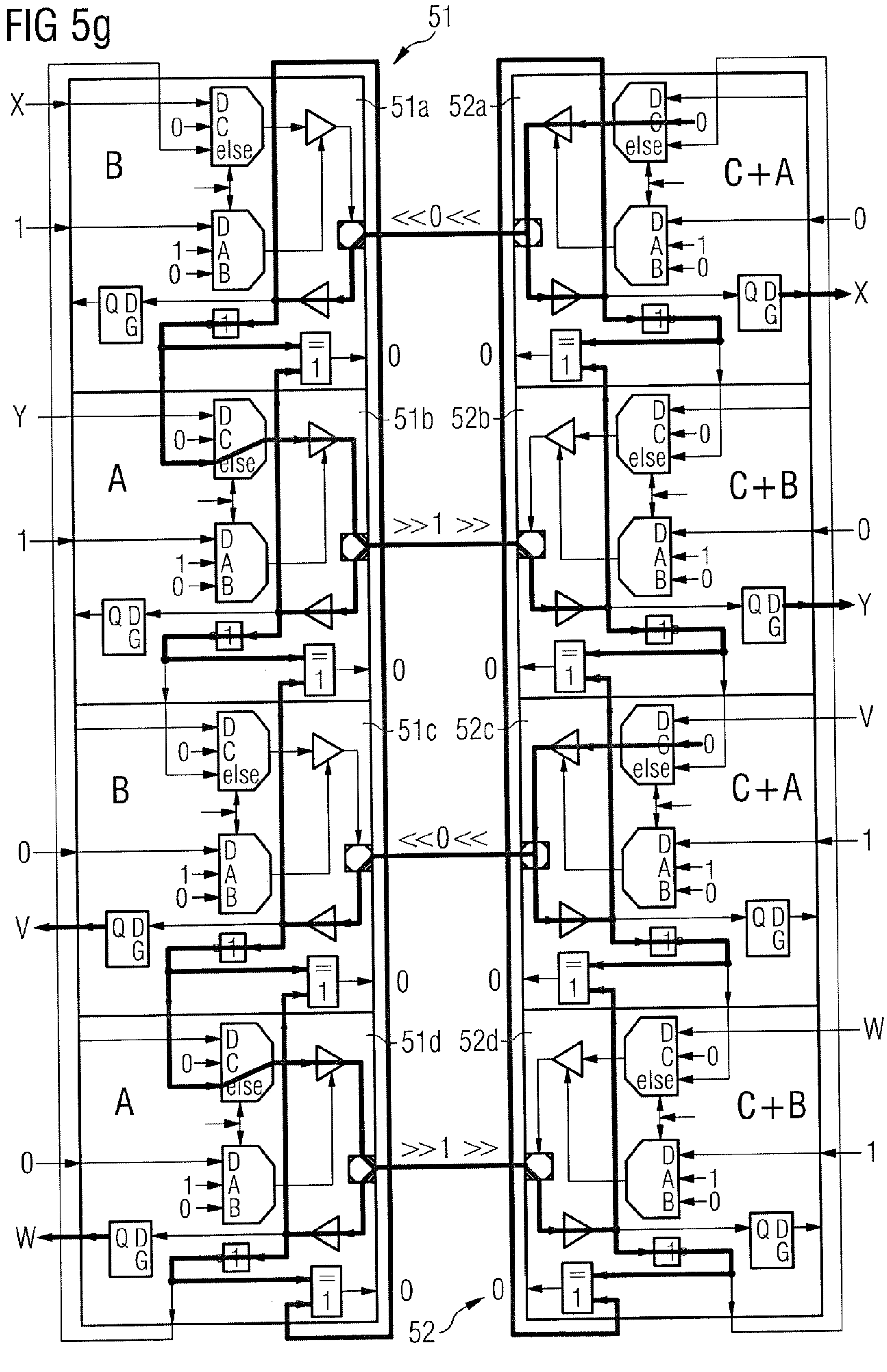

In the, in turn, next step, referring now to FIG. 5*g*, pad structure blocks 52*a* and 52*c* receive the control signal "C+A" which causes the pad structure blocks 52*a* and 52*c* to drive a "0" to their pads and forward the "0" to pad structure blocks 51*a* and 51*c*, respectively, and also to their "upper" neighbors, the blocks 52*d* and 52*b*, respectively. Additionally, the value "0" is inverted ("not 0") and compared with a value received from their "lower" neighbors, the blocks 52*b* and 52*d*, respectively. In pad structure blocks 51*a* and 51*c*, the control signal "B" is asserted which causes the blocks 51*a* and 51*c* to receive and forward the "0" to their "upper" neighbors, the blocks 51*d* and 51*b*, respectively, and to invert the received value and to forward the inverted value ("not 0") to their "lower" neighbors, the blocks 51*b* and 51*d*, respectively, and to compare the inverted value ("not 0") with a value received from their "lower" neighbors, the blocks 51*b* and 51*d*, respectively.

In the same step, the control signal "A" is asserted in pad structure blocks 51*b* and 51*d* causing the blocks 51*b* and 51*d* to receive a value ("1") from their "upper" neighbors, the blocks 51*a* and 51*c*, respectively, drive and forward this value ("1") to pad structure blocks 52*b* and 52*d*, respectively and also to their "upper" neighbors, the blocks 51*a* and 51*c*, respectively, invert this value ("not 1") and compare it with a value received from their "lower" neighbors, the blocks 51*c* and 51*a*, respectively. In pad structure blocks 52*b* and 52*d*, the control signal "C+B" is asserted which causes the blocks 52*b* and 52*d* to receive and forward the "1" to their "upper" neighbors, the blocks 52*a* and 52*c*, respectively, and to compare the complement of the received value ("not 1") with a value received from their "lower" neighbors, blocks 52*c* and 52*a*, respectively.

Having performed six steps (FIGS. 5*b*-5*g*) in the embodiment described above, one loop is completed, i.e. all connections are thoroughly tested, i.e. both signals "0" and "1" have respectively been transmitted via each connection in both directions and all transmitted signals have been checked thereafter. To check the results, it is to be considered that in steps 5*b* and 5*e* the pad structures of both chips receive the control signal "C" and, therefore, all check signals (check_o) must be 1, whereas in steps 5*c*, 5*d*, 5*f*, and 5*g*, the pad structures of only one chip receive the control signal "C" and, therefore, all check signals (check_o) must be 0.

All pad structure blocks of one chip are connected to an associated control logic implemented in the one chip to transmit the results of the signal test to the control logic.

Figure 6:
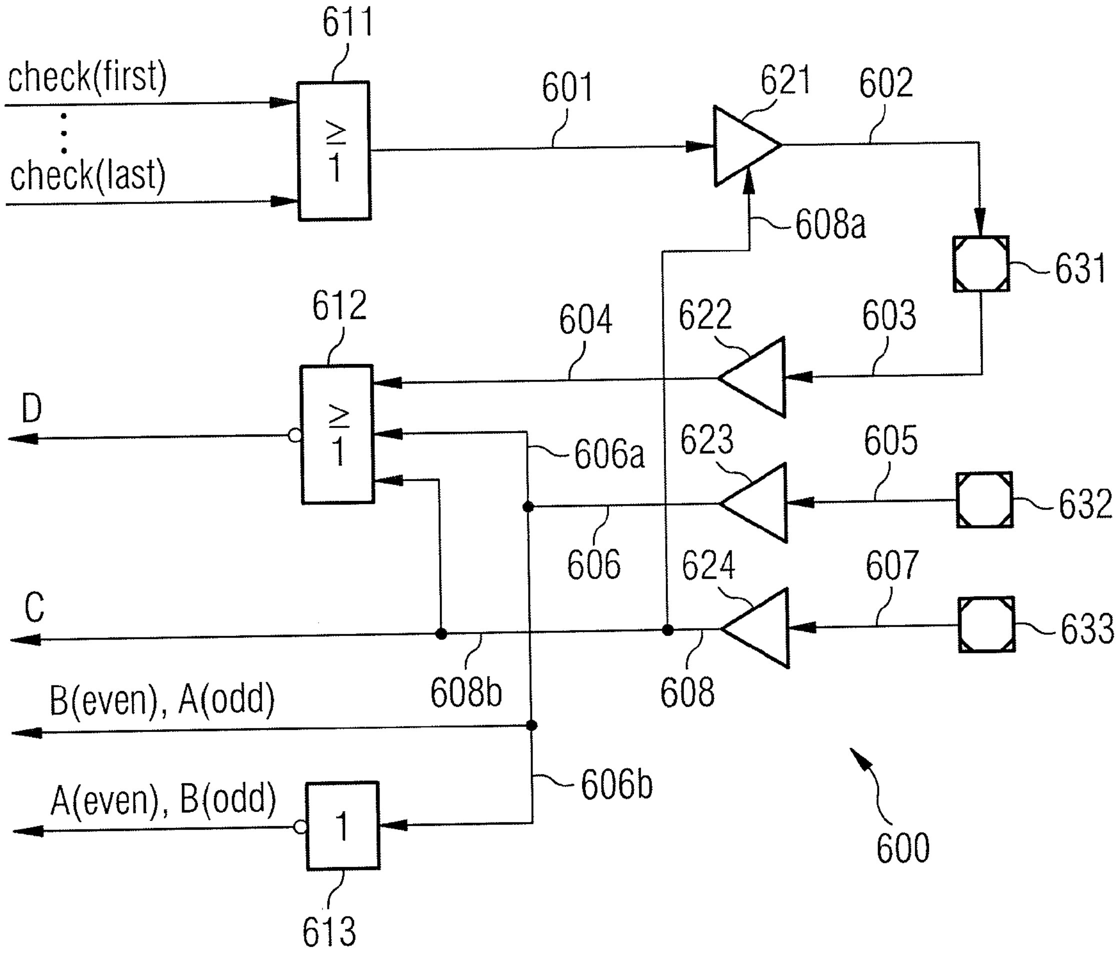
FIG. 6 shows an embodiment of a control logic.

An exemplary embodiment of control logic is shown in FIG. 6. However, it is to be noted that the embodiment shown in FIG. 6 represents only a possible design for a control logic, which could be implemented in a system according to an embodiment of the invention. Of course, any other suitable designs for the control logic circuitries may also be implemented in systems according to an embodiment of the invention.

The control logic 600 of FIG. 6 comprises an OR gate 611, a NOR gate 612, a NOT gate 613, output driver 621, a first input driver 622, a second input driver 623, a third input driver 624, a first pin 631, a second pin 632, and a third pin 633.

The OR gate 611 receives check signals (check(first) . . . check(last)) of the associated pad structure and forwards the result of the OR function via connection 601 to the output driver 621 whose output is connected to the first pin 631 via connection 602.

The first pin 631, the second pin 632, and the third pin 633 are connected to a central control unit located outside the respective chip. Within the control logic 600, the first pin 631 is further connected to the first input driver 622 via connection 603, the output of input driver being connected to the NOR gate 612 via connection 604. The second pin 632 is connected to the second input driver 623 via connection 603 and the output of the second input driver 623 is connected to the NOR gate 612 via connections 606 and 606*a* and to the NOT gate 613 via connections 606 and 606*b*.

As can be seen from FIG. 6, the control logic 600 provides a simple and effective circuitry for converting signals received from a central control unit to control signals (e.g. "A", "B", "C", and "D") suitable for controlling associated pad structures. In this example, the control signals "A" and "B" are generated such that a series of associated pad structure blocks receive the control signals "A" and "B" in an alternating order. It should be noted that the control logic 600 requires only 3 pins for communicating with the control unit.

Figure 7:
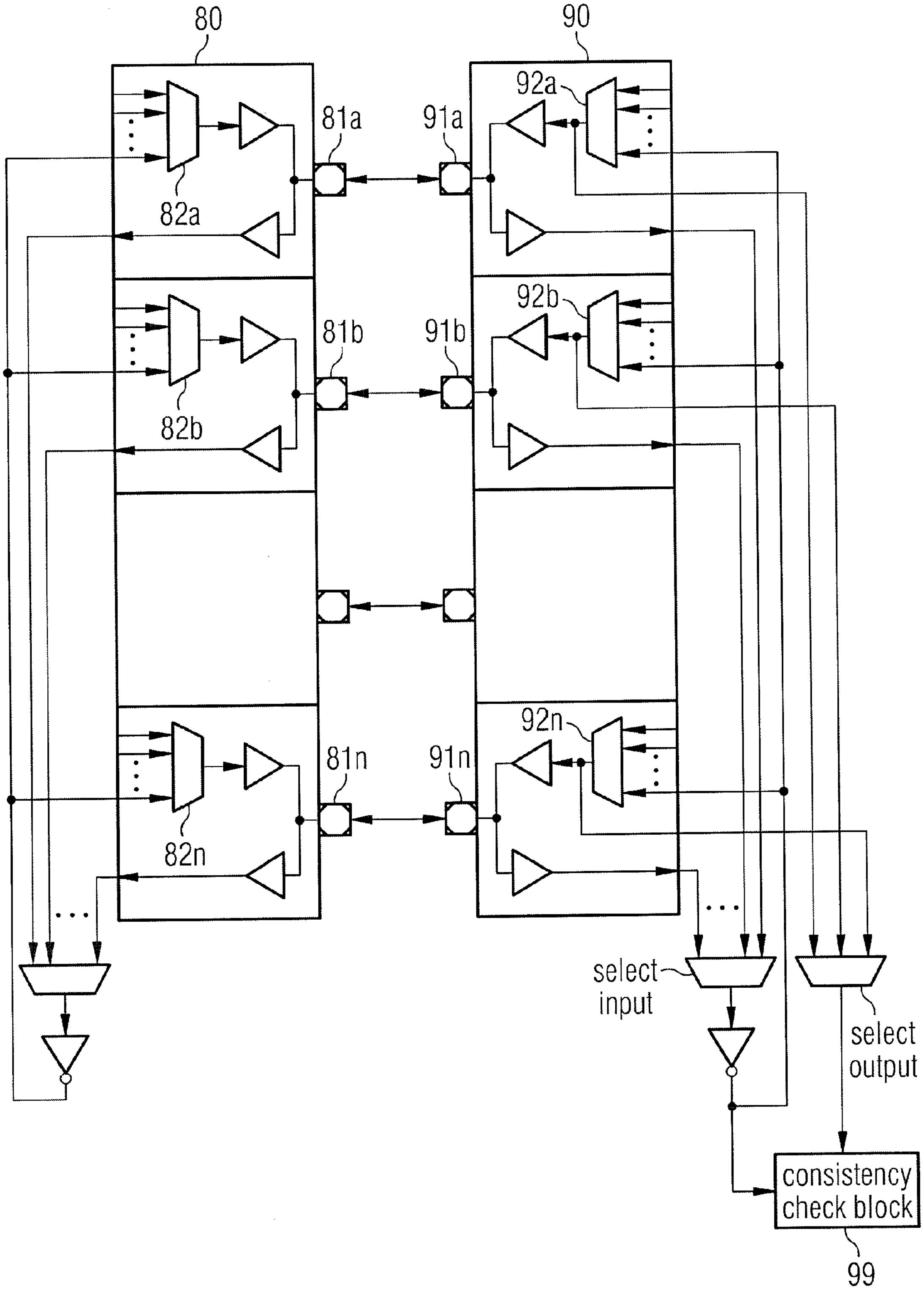
FIG. 7 shows a schematic diagram of a section of a system according to a further embodiment.

FIG. 7 shows a schematic diagram of a section of a system according to a further embodiment which is a multi-purpose test structure for ports and pins (a port is a group of pins). A pin test control block (not explicitly shown in this figure) defines the output pin signal that is to be monitored against an incoming signal. The output multiplexer 82*a*-82*n* and 92*a*-92*n* for each pin 81*a*-81*n* and 91*a*-91*n* can be programmed to drive the desired functional output signal from a group of available output signals. In addition to the programmability, the pin test control block can introduce a test signal to be output that is derived from a selected input pin. This represents the loop back inside the first device 80 (mirror an input signal back to an output). In the second device 90, the input signal at a selected pin is compared to the selected output signal (of the output pin). This is done by consistency check block 99.

In this Figure, the port structure of the first device 80 can mirror back one signal received from the second device 90. The second device 90 is checking the data to be output with its corresponding input data that is mirrored back by the first device 80.

Figure 8A:
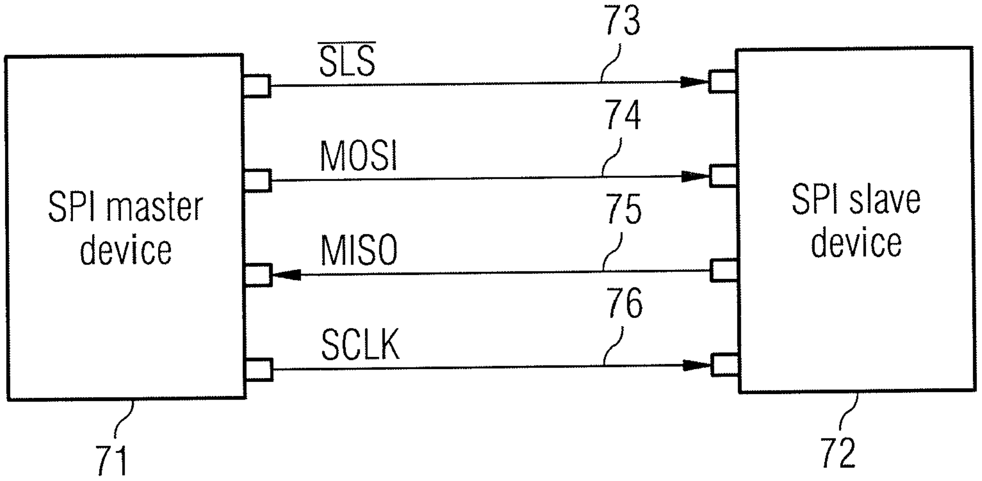
FIG. 8*a* shows an exemplary Serial Peripheral Interface (SPI) connection between a SPI master device and a SPI slave device.

In the following, an exemplary implementation of the connectivity/pin tests already described herein will be illustrated. FIG. 8*a* shows an exemplary Serial Peripheral Interface (SPI) connection between a SPI master device 71 and a SPI slave device 72. However, it is to be appreciated that the SPI connection is illustrated by way of example only. Any data transfer interface connections may be used to implement the connectivity/pin tests provided that they use some kind of enable signals indicating the beginning and the end of a data transfer. An SPI connection uses a slave select line 73 to indicate the beginning and the end of a data transfer. During the data transfer time, some lines (here master out/slave in (MOSI) 74, master in/slave out (MISO) 75, and serial clock (SCLK) 76) have a dedicated function (defining data direction, driver type, etc.) and have to respect a well-defined protocol.

Between two data transfer windows (or data frames) the slave select line is inactive. While the slave select signal is inactive, the levels at the lines MOSI 74, MISO 75, SCLK 76 are ignored by the sending and the receiving devices (master 71 and slave 72), so these lines can be used for connectivity and pin test. Therefore, a self-test during runtime is provided, which does not affect main purpose device operation.

Therefore, a pin test control unit has to "know" when the slave select signal is idle and if more data frames are to be sent soon (request pending). An implementation for an approach to avoid timing collision of test activity and data transfers can be seen in FIG. 8*b*. For example, a handshake mechanism is advantageous to avoid timing collision of the pin test activity and a new incoming request for data transfer. A simple solution is to introduce a WAIT signal delaying the start of the next data frame until the pin test process (or a part of it) has been finished.

If the timing of the slave select inactive period is known in the system, the handshake mechanism is not necessarily needed. In this case, the pin test unit has to be synchronized to the timing of the main pin function.

With the test example as already described herein with reference to FIGS. 3-6, the test procedure for MOSI 74, MISO 75, SCLK 76 (as described above) can take place while slave select 73 is inactive. This is one aspect of pin testing (test of the pins themselves).

An additional aspect is the fact, that during the inactivation time of the slave select 73 of an SPI, the remaining SPI pins can be used for testing connections of other functions (once knowing that the pins themselves are ok, checked by the already described approach). For example, pin signals of other functions (e.g. Universal Asynchronous Receiver Transmitter (UART) or Controller Area Network (CAN), etc.) can be mirrored back to the sending device by using temporarily unused SPI connections.

It should be appreciated that the use of the SPI lines is, of course, only an example of temporarily unused pins and the use of other functional connection lines for the described connectivity/pin test is also possible.

Figure 8B:
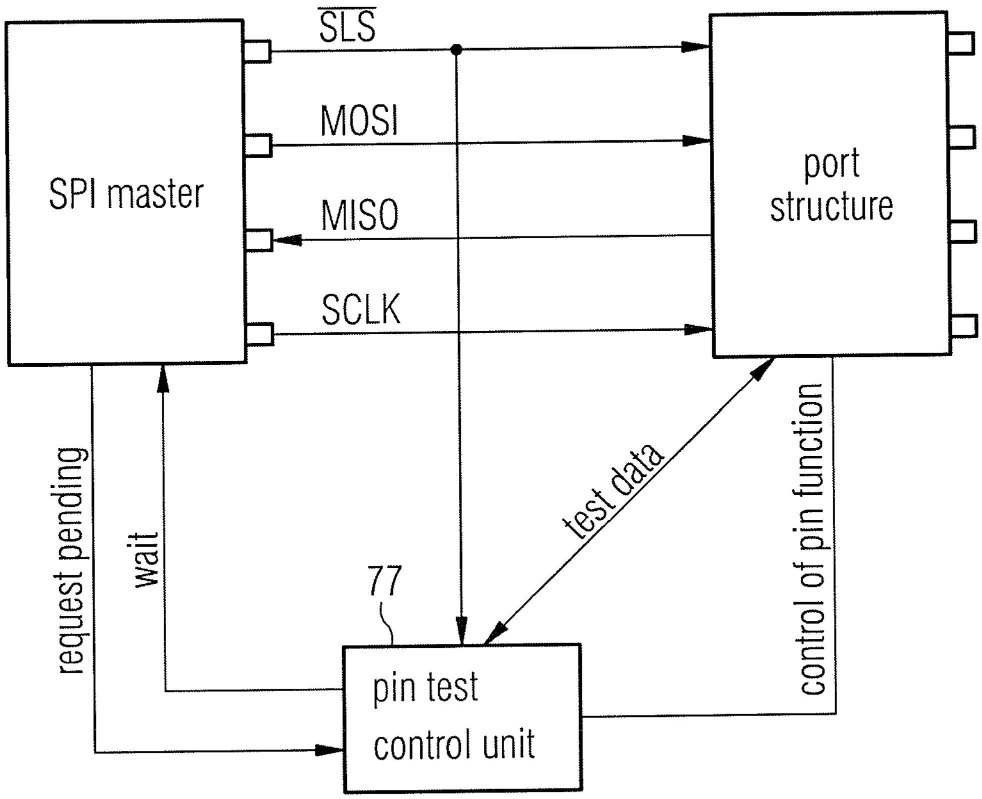
FIG. 8*b* shows a schematic diagram of a section of a system according to a further embodiment implemented in a SPI interface.

In a preferred embodiment, a connectivity/pin test may be carried utilizing both the test structure of FIG. 7 and the SPI connections as described with reference to FIG. 8*b*. Further, if a certain function (e.g. Universal Asynchronous Receiver Transmitter (UART) or Controller Area Network (CAN), etc.) does not directly provide the possibility to use an idle time for pin testing, the related connections may be tested in that test signals are mirrored back via temporarily unused lines of other functions (e.g. Serial Peripheral Interface (SPI)).

With this type of pin test structure, it is possible to scan a certain number of connections between two devices sequentially.

It is to be noted, however, that the pin test functions of both devices have to be synchronized to each other (both devices have to "know" which pin to test, and when). This can be made by defining a sequence of tests in both devices (e.g. define a scan sequence and the duration of the test for the connections to be tested). The sequence is executed step by step in both devices synchronously, because the devices "see" the same slave select line. The configuration of the test sequence can be done by standard communication means between the devices (e.g. by SPI data transfer itself).

However, it should be appreciated that the SPI connections are only an example and this mechanism can be applied to all sorts of functional connections.

An embodiment of the application is directed to a system having a first chip with a first plurality of pad structure blocks, a second chip with a second plurality of pad structure blocks, and a plurality of interconnections respectively connecting a pad structure block of the first plurality of pad structure blocks to a respective pad structure block of the second plurality of pad structure blocks. The pad structure blocks of the first chip are connected among each other to form a ring, and the pad structure blocks of the second chip are connected among each other to form a ring. The first plurality of pad structure blocks is configured to transmit a test signal to the second plurality of pad structure blocks via one connection of the plurality of connections, and the second plurality of pad structure blocks is configured to return the test signal to the first plurality of pad structure blocks via a further connection of the plurality of connections, and the first plurality of pad structure blocks is further configured to compare the test signal with the returned test signal.

Further, the second plurality of pad structure blocks is configured to transmit a further test signal to the first plurality of pad structure blocks via the one connection of the plurality of connections. The first plurality of pad structure blocks is configured to return the further test signal to the second plurality of pad structure blocks via the further connection of the plurality of connections. The second plurality of pad structure blocks is further configured to compare the further test signal with the returned further test signal.

Further, the first chip further includes a first control logic, and the second chip further includes a second control logic. The first control logic and the second control logic are configured to cause the first and second pluralities of pad structures to transmit and return test signals and to compare test signals with respective returned test signals. Respective pad structure blocks of the first and second pluralities of pad structure blocks are configured to transmit a check signal comprising a result of the comparison of test signals to the first control logic and the second control logic, respectively.

Further, the test signal is transmitted from a first pad structure block of the first plurality of pad structure blocks via the one connection to a first pad structure block of the second plurality of pad structure blocks. The test signal is then forwarded from the first pad structure block of the second plurality of pad structure blocks to a second pad structure block of the second plurality of pad structure blocks. The test signal is then transmitted from the second pad structure block of the second plurality of pad structure blocks to a second pad structure block of the first plurality of pad structure blocks. The test signal is then forwarded from the second pad structure block of the first plurality of pad structure blocks to the first pad structure block of the first plurality of pad structure blocks.

A further test signal is transmitted from the first pad structure block of the second plurality of pad structure blocks via the one connection to the first pad structure block of the first plurality of pad structure blocks. The further test signal is then forwarded from the first pad structure block of the first plurality of pad structure blocks to a second pad structure block of the first plurality of pad structure blocks. The further test signal is then transmitted from the second pad structure block of the first plurality of pad structure blocks to the second pad structure block of the second plurality of pad structure blocks. The further test signal is then forwarded from the second pad structure block of the second plurality of pad structure blocks to the first pad structure block of the second plurality of pad structure blocks.

Further, the first pad structure blocks of the first and second plurality of pad structure blocks are configured to invert the received test signal before forwarding it to the second pad structure blocks of the first and second plurality of pad structure blocks, respectively.

The first chip further includes a first control logic, and the second chip further includes a second control logic. The first control logic and the second control logic are configured to cause the first and second pluralities of pad structures to transmit, forward and return test signals and to compare test signals with respective returned test signals. Respective pad structure blocks of the first and second pluralities of pad structure blocks are configured to transmit a check signal comprising a result of the comparison of test signals to the first control logic and the second control logic, respectively.

Another embodiment of the application is directed to a system for testing a plurality of interconnections between a plurality of chips. The system includes a first control logic implemented in a first chip of the plurality of chips, a second control logic implemented in a second chip of the plurality of chips, and a control unit coupled to the first control logic and to the second control logic. The control unit is configured to transmit control signals to the first control logic and to the second control logic to cause the first control logic to transmit signals to and receive signals from the second control logic over the plurality of interconnections, to cause the second control logic to transmit signals to and receive signals from the first control logic over the plurality of interconnections, to cause the first control logic to compare corresponding pairs of sent and received signals to determine if signals are transmitted correctly over a respective interconnection of the plurality of interconnections between the first and second chip, and to cause the second control logic to compare corresponding pairs of sent and received signals to determine if signals are transmitted correctly over a further respective interconnection of the plurality of interconnections between the first and second chip.

Further, the control unit is configured to conduct a test procedure by taking over the plurality of interconnections, executing tests and giving back the plurality of interconnections without active collaboration of functional logics of the plurality of chips. The control unit is further configured to execute multi-step test sequences.

The system may include at least three chips, wherein the plurality of interconnections couple at least one chip with at least two further chips of the at least three chips, and the control unit is configured to cause the plurality of interconnections between the at least three chips to be tested simultaneously or sequentially. The control unit is configured to cause only a part of the system to be tested, whereas the remaining part of the system operates functionally.

The system may include circuitry respectively added to pad structures of the first and second chip, the circuitry being configured to provide connections between different pads of the first chip and between different pads of the second chip. The circuitry includes at least one multiplexer configured to replace output data with test data without affecting a functional logic of a core of the respective chip. The circuitry further includes at least one latch configured to store and forward the input signal before the test to the functional logic of the core of the respective chip, so that reception of test data is not seen by the functional logic.

What is claimed is:

1. A system comprising:

a first chip;

a second chip;

a first connection that couples a first pin of the first chip to a first pin of the second chip;

a second connection that couples a second pin of the second chip to a second pin of the first chip; and a data transfer interface connection that couples a third pin of the first chip to a third pin of the second chip, the data transfer interface connection being configured to provide a plurality of enable signals indicating a plurality of data transfer windows, respectively, to transfer data between the first chip and the second chip via at least one of the first connection and the second connection, wherein the first pin of the second chip is connected via a direct on-chip connection with the second pin of the second chip, to form a return path directly connecting the first pin of the second chip to the second pin of the second chip, wherein the first connection is configured to provide an initial signal from the first chip to the second chip during a time period between two of the plurality of data transfer windows and the second connection is configured to return the initial signal received via the first connection back to the first chip, and wherein the first chip comprises circuitry configured to compare the returned signal with the initial signal.

2. The system of claim 1, wherein the circuitry is further configured to monitor signal characteristics of the initial signal and the returned signal time dependently.

3. A system comprising:

a first chip comprising a first control logic and a first pad structure;

a second chip comprising a second control logic and a second pad structure; and a plurality of interconnections coupling the first and second pad structures and configured to transmit a plurality of data transfer frames between the first chip and the second chip;

wherein the first control logic is configured to cause the first pad structure to transmit a test signal during a time period between the transmission of two of the plurality of data transfer frames to the second pad structure via the plurality of interconnections, wherein the second control logic is configured to cause the second pad structure to return the test signal to the first pad structure, wherein a first pad of the second pad structure is connected via a direct on-chip connection with a second pad of the second pad structure to form a return path directly connecting the first pad of the second chip with the second pad of the second chip, and to return the test signal received via the plurality of interconnections back to the first chip, and wherein the first pad structure is configured to compare the test signal with the test signal returned from the second pad structure.

4. The system of claim 3, further comprising a control unit connected to and configured to control the first control logic and the second control logic.

5. The system of claim 4, wherein the control unit is comprised in the first chip.

6. The system of claim 4, wherein both the first chip and the second chip comprise parts of the control unit, and wherein the parts of the control unit are configured to collaborate to control the first control logic and the second control logic.

7. The system of claim 3, wherein the test signal is inverted before being returned to the first pad structure.

8. The system of claim 7, wherein each or selected interconnections of the plurality of interconnections are tested with a value of "0" and a value of "1" sequentially.

9. A system for testing a plurality of interconnections between a plurality of chips, the system comprising:

a first control logic implemented in a first chip of the plurality of chips;

a second control logic implemented in a second chip of the plurality of chips; and a control unit coupled to the first control logic and to the second control logic, wherein the control unit is configured to transmit control signals to the first control logic and to the second control logic to cause:

the first control logic to transmit first test signals to and receive second test signals from the second control logic over the plurality of interconnections, the second control logic to transmit the second test signals to and receive the first test signals from the first control logic over the plurality of interconnections, the first control logic to compare corresponding pairs of sent and received signals to determine if signals are transmitted correctly over a respective interconnection of the plurality of interconnections between the first and second chip, and the second control logic to compare corresponding pairs of sent and received signals to determine if signals are transmitted correctly over a further respective interconnection of the plurality of interconnections between the first and second chip, wherein a first pin of the first chip is connected via a direct on-chip connection with a second pin of the first chip to form a return path configured to connect directly a first pin of the first chip to a second pin of the first chip, and to return signals transmitted from the second chip to the first chip back to the second chip, wherein a first pin of the second chip is connected via a direct on-chip connection with a second pin of the second chip to form a return path directly connecting a first pin of the second chip to a second pin of the second chip, and to return signals transmitted from the first chip to the second chip back to the first chip, and wherein the first test signals and the second test signals are transmitted during a time period between two data transfer frame transmissions between the first chip and the second chip.

10. The system of claim 9, wherein the control unit is comprised in one chip of the plurality of chips, and is configured to control at least the first control logic and the second control logic.

11. The system of claim 9, wherein each chip of the plurality of chips comprises parts of the control unit, and wherein the parts of the control unit are configured to collaborate to control at least the first control logic and the second control logic.

12. The system of claim 9, wherein the system comprises at least three chips, wherein the plurality of interconnections couple at least one chip with at least two further chips of the at least three chips, and the control unit is configured to cause the plurality of interconnections between the at least three chips to be tested simultaneously or sequentially.

13. A system for testing pins and/or connections between first and second devices, wherein the system is configured to carry out pin and/or connectivity tests during a time period between data transfer frame transmissions between the first and second devices by utilizing a connection between the first and second devices for the pin and/or connectivity test when the connection is not used for the data transfer frame transmissions, wherein a first pin of the second device is connected via a direct on-device connection with a second pin of the second device to form a return path directly connecting a first pin of the second device with the second pin of the second device, and to return a test signal transmitted from the first device to the second device back to the first device.

14. The system of claim 13, wherein the time period lies in between two data transfer windows or data frames.

15. The system of claim 14, wherein a handshake mechanism is used to avoid timing collision of test activity and data transfers.

16. The system of claim 13, wherein the connectivity and/or pin test utilizing the at least one connection is synchronized to a timing of main purpose activity on the at least one connection.

17. The system of claim 13, wherein the at least one connection is a data transfer interface connection, wherein an enable signal is used for synchronizing the connectivity and/or pin test to a timing of main purpose activity.

18. The system of claim 13, wherein the at least one connection is a Serial Peripheral Interface (SPI) connection comprising a slave select line and further SPI connection lines.

19. The system of claim 18, wherein the slave select line is configured to synchronize the connectivity and/or pin test to a timing of main purpose activity on the further SPI connection lines.

20. The system of claim 19, wherein the further SPI connection lines are configured to test connections of other functions.

* * * * *